United States Patent
Ko et al.

(10) Patent No.: US 8,282,844 B2
(45) Date of Patent: Oct. 9, 2012

(54) METHOD FOR ETCHING METAL NITRIDE WITH HIGH SELECTIVITY TO OTHER MATERIALS

(75) Inventors: Akiteru Ko, Peabody, MA (US); Hiroyuki Takahashi, North Andover, MA (US); Masayuki Sawataishi, Kofu (JP)

(73) Assignee: Tokyo Electron Limited, Tokyo (JP)

( * ) Notice: Subject to any disclaimer, the term of this patent is extended or adjusted under 35 U.S.C. 154(b) by 1023 days.

(21) Appl. No.: 11/832,382

(22) Filed: Aug. 1, 2007

(65) Prior Publication Data

US 2009/0032495 A1  Feb. 5, 2009
US 2010/0206841 A2  Aug. 19, 2010

(51) Int. Cl.
*B44C 1/22* (2006.01)

(52) U.S. Cl. ......... 216/37; 216/67; 156/345.1; 118/715; 118/733; 118/620; 204/192.12; 204/192.16; 204/298.31

(58) Field of Classification Search ............. 216/37, 216/67; 156/345; 118/715, 733, 620; 204/192.12, 204/192.16, 298.31
See application file for complete search history.

(56) References Cited

U.S. PATENT DOCUMENTS

| | | | | |
|---|---|---|---|---|
| 4,618,398 A * | 10/1986 | Nawata et al. | | 438/720 |
| 5,001,085 A * | 3/1991 | Cathey et al. | | 438/702 |
| 5,480,051 A * | 1/1996 | Hain | | 216/67 |
| 5,612,558 A | 3/1997 | Harshfield | | |
| 5,824,606 A | 10/1998 | Dible et al. | | |
| 5,968,711 A | 10/1999 | Lee et al. | | |
| 6,284,146 B1 * | 9/2001 | Kim et al. | | 216/6 |
| 6,531,404 B1 | 3/2003 | Nallan et al. | | |
| 6,939,795 B2 | 9/2005 | Eissa et al. | | |
| 7,282,773 B2 | 10/2007 | Li et al. | | |
| 7,312,120 B2 | 12/2007 | Shea | | |
| 2006/0086692 A1* | 4/2006 | Fujimoto et al. | | 216/67 |
| 2006/0137710 A1* | 6/2006 | Lim et al. | | 134/1.1 |

FOREIGN PATENT DOCUMENTS

EP  0924753 A2  6/1999
WO  2005038863 A2  4/2005

OTHER PUBLICATIONS

International Searching Authority, International Search Report and Written Opinion, International Application No. PCT/US08/70920, Mailed Oct. 2, 2008, 7 pages.
Luong, Vinh, U.S. Appl. No. 12/729,538, filed Mar. 23, 2010.

* cited by examiner

*Primary Examiner* — Nadine G. Norton
*Assistant Examiner* — Maki Angadi

(57) ABSTRACT

A method and system of etching a metal nitride, such as titanium nitride, is described. The etching process comprises introducing a process composition having a halogen containing gas, such as $Cl_2$, HBr, or $BCl_3$, and a hydrocarbon gas having the chemical formula $C_xH_y$, where x and y are equal to unity or greater.

14 Claims, 11 Drawing Sheets

METHOD FOR ETCHING METAL NITRIDE WITH HIGH SELECTIVITY TO OTHER MATERIALS

CROSS-REFERENCE TO RELATED APPLICATIONS

This application is related to pending U.S. patent application Ser. No. 11/690,256, entitled "Method and system for dry etching a metal nitridee", Attorney docket no. 313530-P0043, filed on Mar. 23, 2007. The entire content of this application is herein incorporated by reference in its entirety.

BACKGROUND OF THE INVENTION

1. Field of Invention

The present invention relates to a method and system for etching a metal nitride layer on a substrate using a dry plasma process.

2. Description of Related Art

As the size of semiconductor devices is reduced, process development and integration issues are key challenges for new gate stack materials including high-permittivity dielectric materials (also referred to herein as "high-k" materials). Dielectric materials featuring a dielectric constant greater than that of $SiO_2$ (k~3.9) are commonly referred to as high-k materials. In addition, high-k materials may refer to dielectric materials that are deposited onto substrates (e.g., $HfO_2$, $ZrO_2$) rather than grown on the surface of the substrate (e.g. $SiO_2$, $SiN_xO_y$). High-k materials may incorporate metallic silicates or oxides (e.g., $Ta_2O_5$ (k~26), $TiO_2$ (k~80), $ZrO_2$ (k~25), $Al_2O_3$ (k~9), HfSiO, $HfO_2$ (k~25)). For front-end-of-line (FEOL) operations, in the near future, these high-k materials are contemplated for integration with polycrystalline silicon (polysilicon) gate structures and, in the longer term, they are contemplated for use with metal gates. However, the integration of high-k materials with polysilicon gate structures generally requires the insertion of a thin layer, such as a metal nitride, between the high-k layer and the polysilicon layer which may act as a barrier layer. This material must be etched while minimizing damage to the gate structure, etc. Furthermore, metal nitrides are contemplated for use in metal gates, and must be etched while minimizing damage to the underlying structure. Of course, many other needs exist in semiconductor processing for etching a metal containing layer. One example includes etching portions of a metal containing barrier layer in a contact or via during metallization processes for backend-end-of-line (BEOL) operations. Another example includes etching portions of metal containing layers in capacitors for DRAM production.

SUMMARY OF THE INVENTION

The present invention relates to a method and system for etching a metal nitride layer on a substrate. The method comprises using a process composition having a halogen-containing gas and a hydrocarbon gas having the chemical formula $C_xH_y$, where x and y are equal to unity or greater.

According to one embodiment, a method of etching a metal containing layer on a substrate is provided. The substrate having a metal nitride layer is disposed in a plasma processing system, wherein a mask layer defining a pattern therein overlies the metal nitride layer. The temperature of the substrate is elevated above approximately 30 degrees C. A process composition comprising a halogen-containing gas and a hydrocarbon gas is introduced to the plasma processing system. The hydrocarbon gas comprises the chemical formula $C_xH_y$, where x and y are equal to unity or greater. Plasma is formed from the process composition in the plasma processing system. The substrate is exposed to the plasma in order to etch the pattern into the metal nitride layer.

DETAILED DESCRIPTION OF SEVERAL EMBODIMENTS

In the following description, for purposes of explanation and not limitation, specific details are set forth, such as a particular geometry of the plasma processing system and descriptions of various processes. However, it should be understood that the invention may be practiced in other embodiments that depart from these specific details.

In material processing methodologies, pattern etching can comprise the application of a thin layer of light-sensitive material, such as photo-resist, to an upper surface of a substrate that is subsequently patterned in order to provide a mask for transferring this pattern to the underlying thin film on a substrate during etching. The patterning of the light-sensitive material generally involves exposure of the light-sensitive material to a geometric pattern of electro-magnetic (EM) radiation using, for example, a micro-lithography system, followed by the removal of the irradiated regions of the light-sensitive material (as in the case of positive photo-resist), or non-irradiated regions (as in the case of negative resist) using a developing solvent.

During pattern etching, a dry plasma etching process can be utilized, wherein plasma is formed from a process gas by coupling electro-magnetic (EM) energy, such as radio frequency (RF) power, to the process gas in order to heat electrons and cause subsequent ionization and dissociation of the atomic and/or molecular composition of the process gas. Using a series of dry etching processes, the pattern formed in the initial mask layer, using for instance a photo-lithographic process as described above, is transferred to the underlying layers within a film stack, including the one or more material layers that are desired for the end product, e.g., electronic device.

Figure 1A:
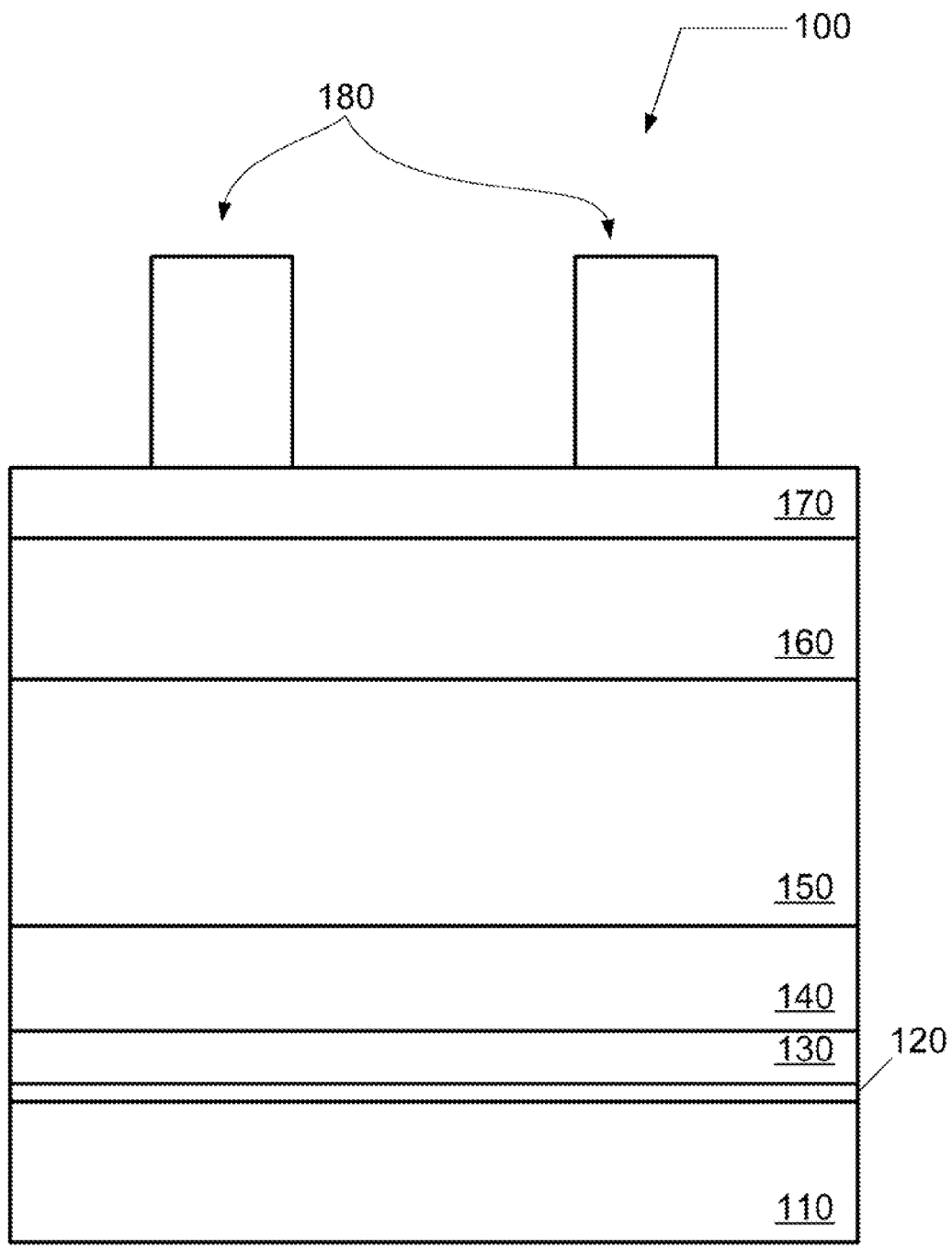
FIGS. 1A, 1B, and 1C illustrate a schematic representation of a procedure for pattern etching a film stack according to an embodiment.
Figure 1B:
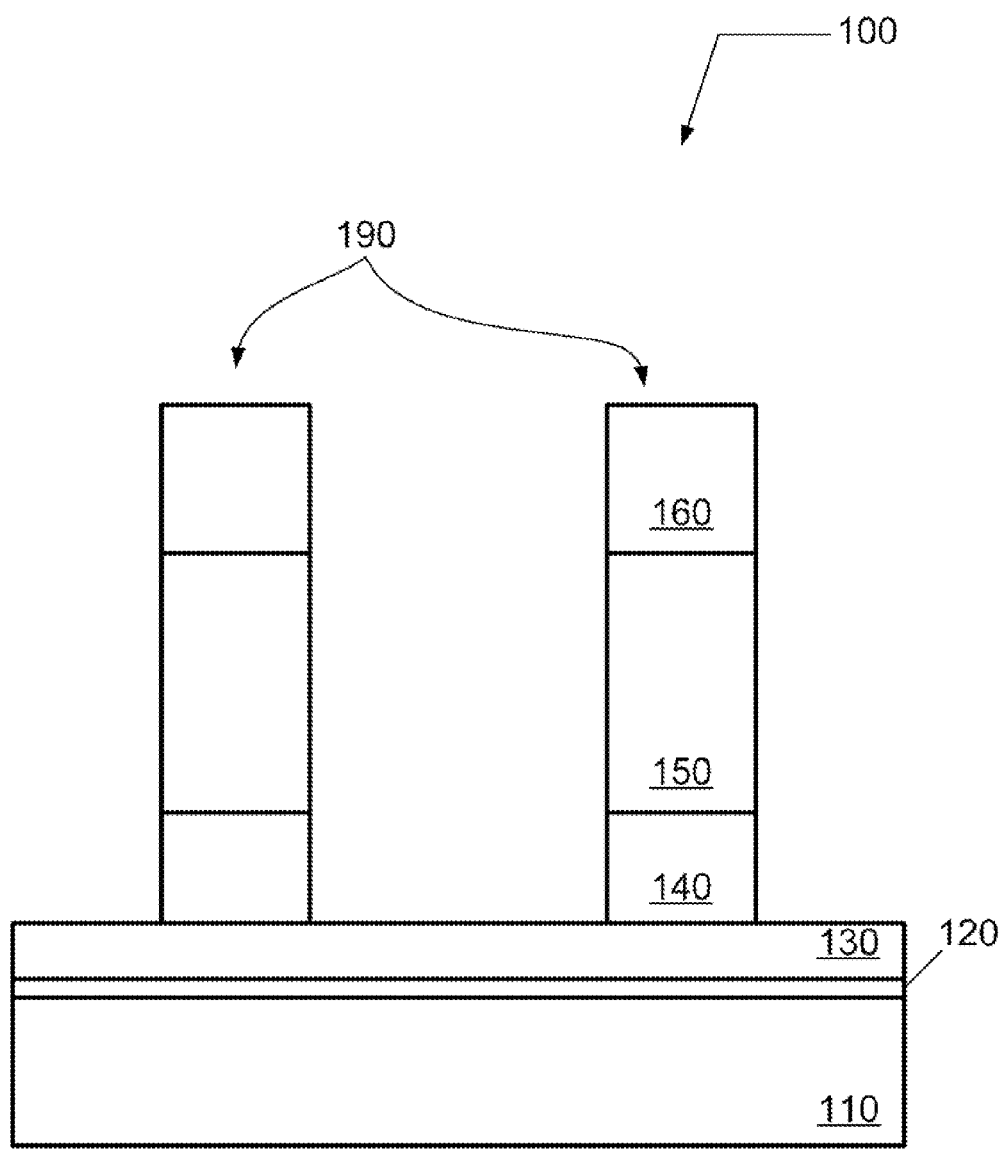
Figure 1C:
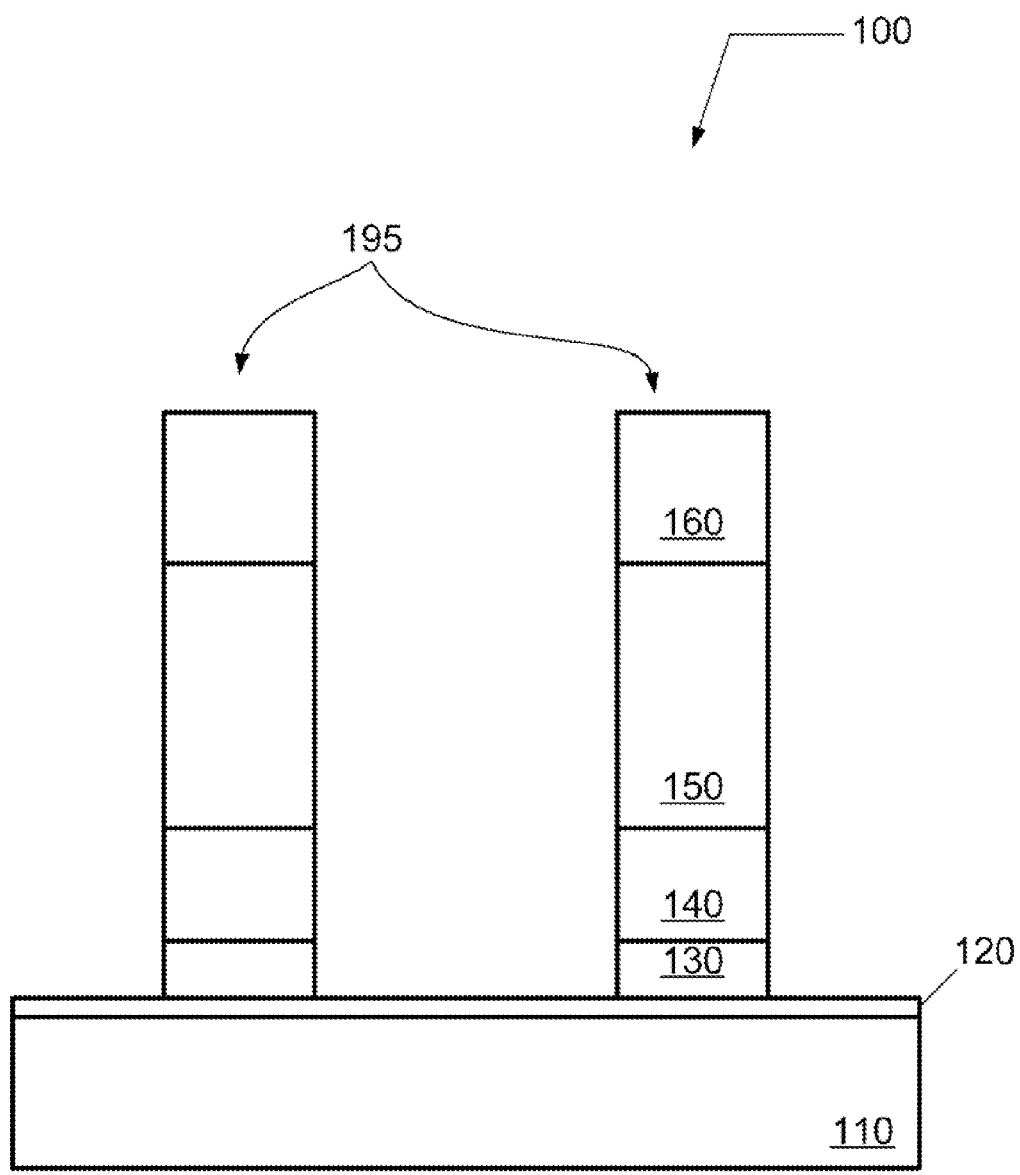

For example, as shown in FIGS. 1A through 1C, a film stack 100 comprising a plurality of layers 120 through 170 formed on a substrate 110 is illustrated. The film stack 100 may, for example, include a polycrystalline silicon (polysilicon, or poly-Si) gate stack having a polysilicon layer 150, a metal-containing layer 140, and a high dielectric constant (high-k) dielectric layer 130 as the gate dielectric or part of the gate dielectric. Alternatively, film stack 100 may, for example, include a tungsten-containing layer 150, a metal-containing layer 140, and a high dielectric constant (high-k) dielectric layer 130 as the gate dielectric or part of the gate dielectric. The metal-containing layer 140 can, for example, be part of a poly-Si gate electrode. The metal containing layer 140 may be several hundred Angstroms (Å) thick, for instance, about 100 Å thick, and it may comprise a metal nitride. For example, metal-containing layer 140 can contain titanium nitride (TiN), titanium silicon nitride, titanium aluminum nitride, tantalum nitride, tantalum silicon nitride, hafnium nitride, hafnium silicon nitride, or aluminum nitride. The metal-containing layer 140 in the gate electrode can replace or be integrated with the traditional poly-Si gate electrode layer.

Furthermore, the gate dielectric may further include an interfacial layer 120, such as a thin layer of silicon dioxide ($SiO_2$) between the high-k layer and the substrate. The high-k dielectric layer 130 may, for example, comprise a hafnium containing layer, such as a hafnium oxide layer (e.g., $HfO_2$) or hafnium silicate layer (e.g., HfSiO). Additionally, for example, the high-k dielectric layer 130 may incorporate metallic silicates or oxides (e.g., $Ta_2O_5$ (k~26), $TiO_2$ (k~80), $ZrO_2$ (k~25), $Al_2O_3$ (k~9), HfSiO, $HfO_2$ (k~25)). Furthermore, for example, the high-k dielectric layer 130 may include mixed rare earth oxides, mixed rare earth aluminates, mixed rare earth nitrides, mixed rare earth aluminum nitrides, mixed rare earth oxynitrides, or mixed rare earth aluminum oxynitrides.

The film stack 100 further comprises a patterned mask layer 180, such as a layer of photo-resist having a pattern formed therein using a photo-lithographic process. Additionally, for example, the film stack 100 may include an anti-reflective coating (ARC) layer 170 for use in patterning the mask layer 180, and one or more hard mask layers 160, such as a silicon dioxide ($SiO_2$) hard mask for dry etching the polysilicon layer 150.

As illustrated in FIGS. 1B and 1C, the series of etching processes for transferring the pattern to the underlying stack of films is selected to preserve the integrity of the pattern being transferred, e.g., critical dimensions, etc., as well as minimize damage to those layers which are utilized in the electronic device being fabricated.

One etch process includes the transfer of the pattern to the metal-containing layer 140 without damaging, for example, the poly-Si layer 150 or the underlying high-k layer 130 or other layers on the substrate, including silicon dioxide layers. According to an embodiment, the pattern etching process for transferring a pattern into metal-containing layer 140 comprises introducing a process composition having a halogen-containing gas and a hydrocarbon gas having the chemical formula $C_xH_y$, where x and y are equal to unity or greater. For example, the halogen-containing gas can include $Cl_2$, HBr, or $BCl_3$, or a combination of two or more thereof. Additionally, for example, the hydrocarbon gas can include $CH_4$, $C_2H_4$, $C_2H_2$, $C_2H_6$, $C_3H_4$, $C_3H_6$, $C_3H_8$, $C_4H_6$, $C_4H_8$, $C_4H_{10}$, $C_5H_8$, $C_6H_{10}$, $C_6H_6$, $C_6H_{10}$, or $C_6H_{12}$, or a combination of two or more thereof. The process composition can further include an inert gas, such as a noble gas (e.g., He, Ne, Ar, Kr, Xe).

Another etch process includes the transfer of the pattern to the high-k dielectric firm 130 without damaging, for example, the poly-Si layer 150 or the underlying $SiO_2$ interfacial layer 120 or both. Conventional processes for etching a hafnium containing high-k layer include using $HBr/Cl_2$-based process chemistries. However, these etch chemistries are known to etch the poly-Si layer 150 and the underlying $SiO_2$ interfacial layer 120. For example, when using a $HBr/Cl_2$-based process chemistry, the inventors have observed an etch selectivity between $HfO_2$ and poly-Si larger than 10, yet they have observed an etch selectivity between $HfO_2$ and $SiO_2$ ranging only from 1.5 to 2.5.

The pattern etching process for transferring a pattern into high-k dielectric layer 130 comprises introducing a process composition comprising $BCl_3$ and an additive gas. The additive gas is expected to serve as a passivation gas, whereby the additive gas provides passivation of surfaces where etching is undesirable. Thus, the pattern etching process can provide improvements in the etch selectivity between $HfO_2$ and those materials where etching is not intended such as poly-Si and $SiO_2$, for example.

The additive gas can comprise an oxygen containing gas, a nitrogen containing gas, or a hydrocarbon gas (characterized by $C_xH_y$, wherein x and y are integers greater than or equal to unity), or a combination of two or more thereof. For example, the oxygen containing gas can comprise $O_2$, NO, $NO_2$, $N_2O$, CO, or $CO_2$, or a combination of two or more thereof. Additionally, for example, the nitrogen containing gas can comprise $N_2$, or $NH_3$, or a combination of two or more thereof. Furthermore, the hydrocarbon gas can comprise $C_2H_4$, $CH_4$, $C_2H_2$, $C_2H_6$, $C_3H_4$, $C_3H_6$, $C_3H_8$, $C_4H_6$, $C_4H_8$, $C_4H_{10}$, $C_5H_8$, $C_5H_{10}$, $C_6H_6$, $C_6H_{10}$, or $C_6H_{12}$, or two or more thereof. The process composition can further include an inert gas, such as a noble gas (e.g., He, Ne, Ar, Kr, Xe). Additional details are provided in pending U.S. patent application Ser. No. 11/518,890, entitled "METHOD AND SYSTEM FOR DRY ETCHING A HAFNIUM CONTAINING LAYER", filed on Sep. 12, 2006; the contents of which are incorporated herein by reference in their entirety.

Figure 2:
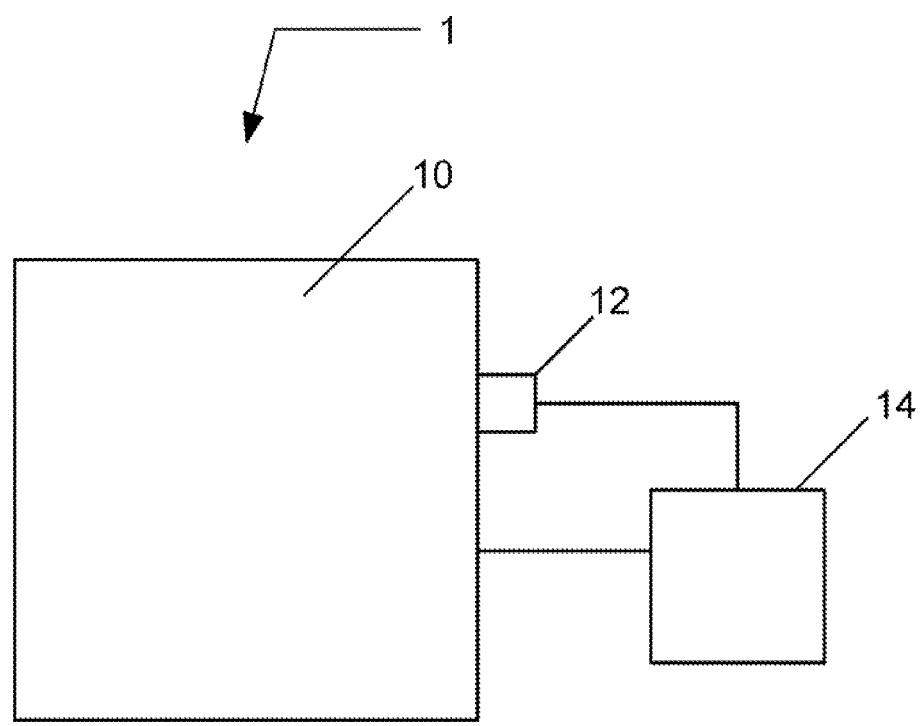
FIG. 2 shows a simplified schematic diagram of a plasma processing system according to an embodiment.

According to one embodiment, a plasma processing system 1 is depicted in FIG. 2 comprising a plasma processing chamber 10, an optional diagnostic system 12 coupled to the plasma processing chamber 10, and a controller 14 coupled to the optional diagnostic system 12 and the plasma processing chamber 10. The controller 14 is configured to execute a process recipe comprising at least one step configured to etch a metal nitride layer using plasma formed from the introduction of a process composition having a halogen-containing gas and a hydrocarbon gas having the chemical formula $C_xH_y$, where x and y are equal to unity or greater, as described above. Additionally, controller 14 is optionally configured to receive at least one endpoint signal from the diagnostic system 12 and to post-process the at least one endpoint signal in order to accurately determine an endpoint for the process. Alternatively, controller 14 utilizes a pre-determined time to set the endpoint of the process. In the illustrated embodiment, plasma processing system 1, depicted in FIG. 2, utilizes plasma for material processing. Plasma processing system 1 can comprise an etch chamber.

Figure 3:
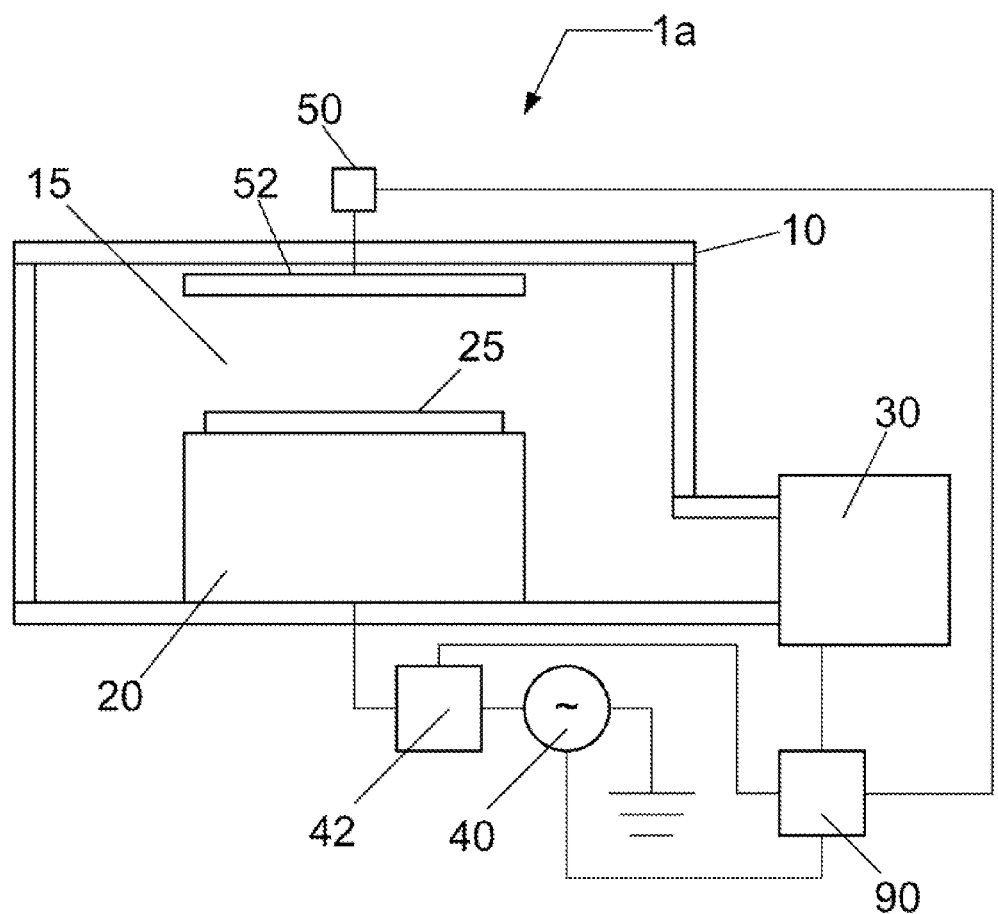
FIG. 3 shows a schematic diagram of a plasma processing system according to another embodiment.

FIG. 3 illustrates a plasma processing system according to another embodiment. Plasma processing system 1a comprises a plasma processing chamber 10, substrate holder 20, upon which a substrate 25 to be processed is affixed, and vacuum pumping system 30. Substrate 25 can be a semiconductor substrate, a wafer or a liquid crystal display. Plasma processing chamber 10 can be configured to facilitate the generation of plasma in processing region 15 adjacent a surface of substrate 25. An ionizable gas or mixture of gases is introduced via a gas injection system (not shown) and the process pressure is adjusted. For example, a control mechanism (not shown) can be used to throttle the vacuum pumping system 30. Plasma can be utilized to create materials specific to a pre-determined materials process, and/or to aid the removal of material from the exposed surfaces of substrate 25. The plasma processing system 1a can be configured to process a substrate of any size, such as 200 mm substrates, 300 mm substrates, or larger.

Substrate 25 can be affixed to the substrate holder 20 via an electrostatic clamping system. Furthermore, substrate holder 20 can further include a temperature control system for controlling the temperature of substrate 25 during various etching processes. For example, during an etching process for etching a metal nitride layer, such as a titanium nitride layer, the temperature control system comprises a heating system configured to elevate the temperature of substrate 25 to approximately 30 degrees C. or greater. Alternatively, the temperature control system comprises a heating system configured to elevate the temperature of substrate 25 to approximately 50 degrees C. or greater. Attentively, the temperature control system comprises a heating system configured to elevate the temperature of substrate 25 to approximately 75 degrees C. or greater. Alternatively, the temperature control system comprises a heating system configured to elevate the temperature of substrate 25 to approximately 100 degrees C. or greater. Alternatively yet, the temperature control system comprises a heating system configured to elevate the temperature of substrate 25 to approximately 200 degrees C. or greater. For example, the substrate temperature may range from approximately 50 degrees C. to approximately 250 degrees, and can range from approximately 50 degrees C. to approximately 100 degrees C.

Additionally for example, during an etching process for etching a poly-Si layer, the temperature control system comprises a heating system configured to elevate the temperature of substrate 25 to approximately 100 degrees C. or less. Further yet for example, during an etching process for etching a $SiO_2$ layer, the temperature control system comprises a cooling system configured to reduce or maintain the temperature of substrate 25 at approximately 20 to 30 degrees C.

The substrate holder 20 can comprise a temperature control system having a cooling system or a heating system or both. For instance, the cooling system or heating system can include a re-circulating fluid flow that receives heat from substrate holder 20 and transfers heat to a heat exchanger system (not shown) when cooling, or transfers heat from the heat exchanger system to the fluid flow when heating. Additionally, for instance, the cooling system or heating system may comprise heating/cooling elements, such as resistive heating elements, or thermo-electric heaters/coolers located within the substrate holder 20

Moreover, the substrate holder 20 can facilitate the delivery of heat transfer gas to the back-side of substrate 25 via a backside gas supply system to improve the gas-gap thermal conductance between substrate 25 and substrate holder 20. Such a system can be utilized when temperature control of the substrate is required at elevated or reduced temperatures. For example, the backside gas system can comprise a two-zone gas distribution system, wherein the backside gas (e.g., helium) pressure can be independently varied between the center and the edge of substrate 25.

In other embodiments, heating/cooling elements, such as resistive heating elements, or thermo-electric heaters/coolers can be included in the chamber wall of the plasma processing chamber 10 and any other component within the plasma processing system 1a.

In the embodiment shown in FIG. 3, substrate holder 20 can comprise an electrode through which RF power is coupled to the processing plasma in process space 15. For example, substrate holder 20 can be electrically biased at a RF voltage via the transmission of RF power from a RF generator 40 through an optional impedance match network 42 to substrate holder 20. The RF bias can serve to heat electrons to form and maintain plasma or affect the ion energy distribution function within the sheath, or both. In this configuration, the system can operate as a reactive ion etch (RIE) reactor, wherein the chamber can serve as ground surfaces. A typical frequency for the RF bias can range from 0.1 MHz to 100 MHz. RF systems for plasma processing are well known to those skilled in the art.

Furthermore, impedance match network 42 serves to improve the transfer of RF power to plasma in plasma processing chamber 10 by reducing the reflected power. Match network topologies (e.g. L-type, π-type, T-type, etc.) and automatic control methods are well known to those skilled in the art.

Referring still to FIG. 3S plasma processing system 1a optionally comprises a direct current (DC) power supply 50 coupled to an upper electrode 52 opposing substrate 25. The upper electrode 52 may comprise an electrode plate. The electrode plate may comprise a silicon-containing electrode plate. Moreover, the electrode plate may comprise a doped silicon electrode plate. The DC power supply can include a variable DC power supply. Additionally, the DC power supply can include a bipolar DC power supply. The DC power supply 50 can further include a system configured to perform monitoring adjusting, or controlling the polarity, current, voltage, or on/off state of the DC power supply 50 or any combination thereof. Once plasma is formed, the DC power supply 50 facilitates the formation of a ballistic electron beam. An electrical filter may be utilized to de-couple RF power from the DC power supply 50.

For example, the DC voltage applied to electrode 52 by DC power supply 50 may range from approximately −2000 volts (V) to approximately 1000 V. Desirably, the absolute value of the DC voltage has a value equal to or greater than approximately 100 V, and more desirably, the absolute value of the DC voltage has a value equal to or greater than approximately 500 V. Additionally, it is desirable that the DC voltage has a negative polarity. Furthermore, it is desirable that the DC voltage is a negative voltage having an absolute value greater than the self-bias voltage generated on a surface of the upper electrode 52. The surface of the upper electrode 52 facing the substrate holder 20 may be comprised of a silicon-containing material.

Vacuum pump system 30 can include a turbo-molecular vacuum pump (TMP) capable of a pumping speed up to 5000 liters per second (and greater) and a gate valve for throttling the chamber pressure. In conventional plasma processing devices utilized for dry plasma etch, a 1000 to 3000 liter per second TMP can be employed. TMPs can be used for low pressure processing, typically less than approximately 50 mTorr. For high pressure processing (i.e. greater than approximately 100 mTorr), a mechanical booster pump and dry roughing pump can be used. Furthermore, a device for monitoring chamber pressure (not shown) can be coupled to the plasma processing chamber 10. The pressure measuring device can be, for example, a Type 6288 Baratron absolute capacitance manometer commercially available from MKS Instruments, Inc. (Andover, Mass.).

Referring still to FIG. 3, plasma processing system 1a further comprises a controller 90 that comprises a microprocessor, memory, and a digital I/O port capable of generating control voltages sufficient to communicate and activate inputs to plasma processing system 1a as well as monitor outputs from plasma processing system 1a. Moreover, controller 90 can be coupled to and can exchange information with RF generator 40, impedance match network 42, optional DC power supply 50, the gas injection system (not shown), vacuum pumping system 30, as well as the backside gas delivery system (not shown), the substrate/substrate holder temperature control system (not shown), and/or the electrostatic clamping system (not shown). A program stored in the memory can be utilized to activate the inputs to the aforementioned components of plasma processing system 1a according to a process recipe in order to perform the method of etching a thin film. One example of controller 90 is a DELL PRECISION WORKSTATION 610™ available from Dell Corporation, Austin, Tex.

Controller 90 may be locally located relative to the plasma processing system 1a, or it may be remotely located relative to the plasma processing system 1a via an internet or intranet. Thus, controller 90 can exchange data with the plasma processing system 1a using at least one of a direct connection, an intranet, or the internet. Controller 90 may be coupled to an intranet at a customer site (i.e., a device maker, etc.), or coupled to an intranet at a vendor site (i.e., an equipment manufacturer). Furthermore, another computer (i.e., controller, server, etc.) can access controller 90 to exchange data via at least one of a direct connection, an intranet, or the internet.

Figure 4:
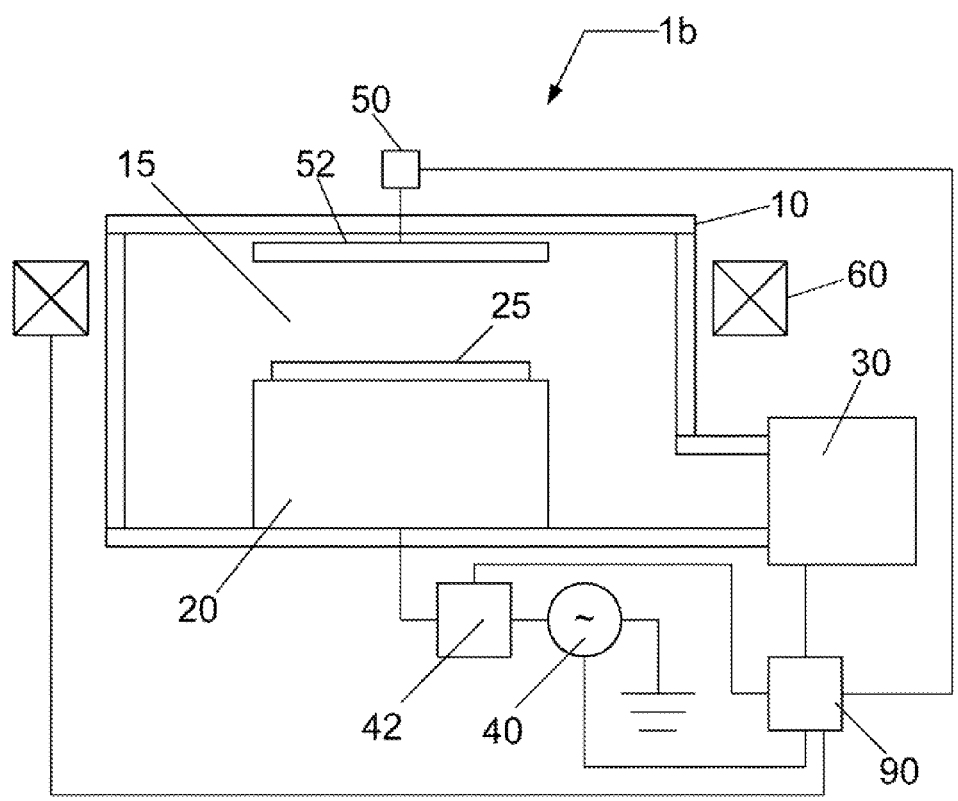
FIG. 4 shows a schematic diagram of a plasma processing system according to another embodiments.

In the embodiment shown in FIG. 4, the plasma processing system 1b can be similar to the embodiment of FIG. 2 or 3 and further comprise either a stationary, or mechanically or electrically rotating magnetic field system 60, in order to potentially increase plasma density and/or improve plasma processing uniformity. Moreover, controller 90 can be coupled to magnetic field system 60 in order to regulate the speed of rotation and field strength. The design and implementation of a rotating magnetic field is well known to those skilled in the art.

Figure 5:
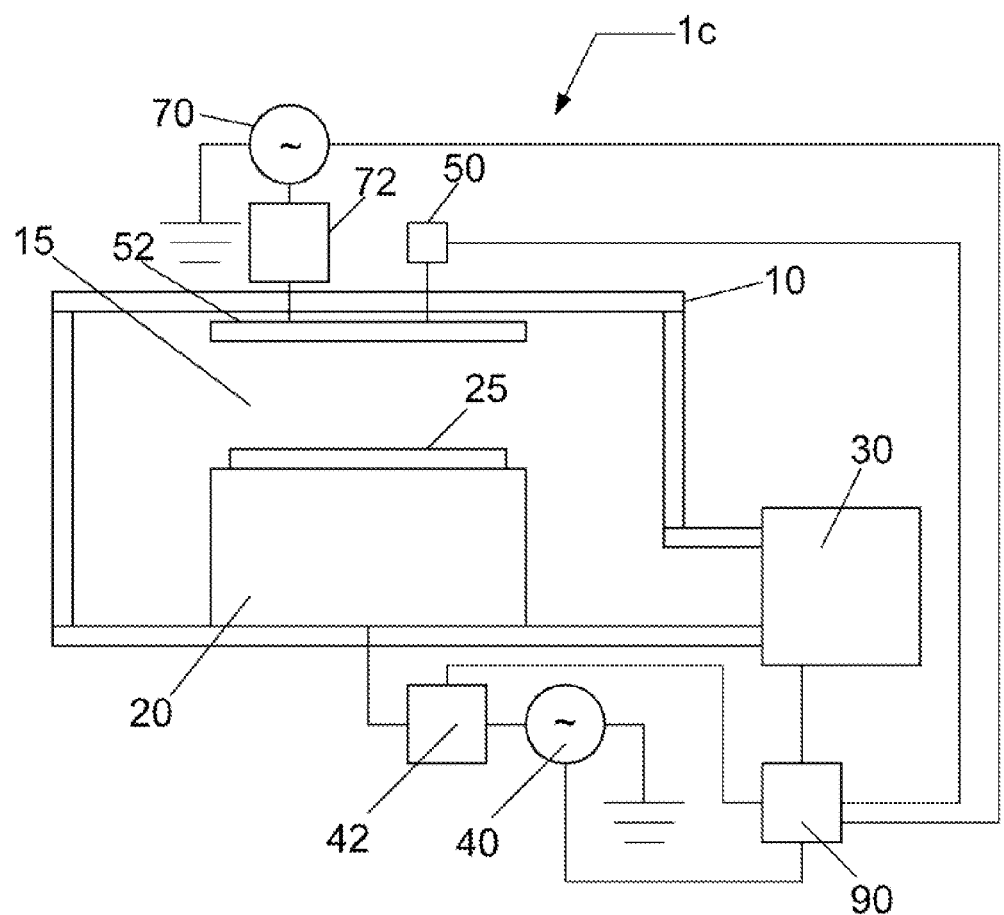
FIG. 5 shows a schematic diagram of a plasma processing system according to another embodiment.

In the embodiment shown in FIG. 5, the plasma processing system 1c can be similar to the embodiment of FIG. 2 or FIG. 3, and can further comprise an RF generator 70 configured to couple RF power to upper electrode 52 through an optional impedance match network 72. A typical frequency for the application of RF power to upper electrode 52 can range from about 0.1 MHz to about 200 MHz. Additionally, a typical frequency for the application of power to the substrate holder 20 (or lower electrode) can range from about 0.1 MHz to about 100 MHz. For example, the RF frequency coupled to the upper electrode 52 can be relatively higher than the RF frequency coupled to the substrate holder 20. Furthermore, the RF power to the upper electrode 52 from RF generator 70 can be amplitude modulated, or the RF power to the substrate holder 20 from RF generator 40 can be amplitude modulated, or both RF powers can be amplitude modulated. For example, the RF power at the higher RF frequency is amplitude modulated. Moreover, controller 90 is coupled to RF generator 70 and impedance match network 72 in order to control the application of RF power to upper electrode 70. The design and implementation of an upper electrode is well known to those skilled in the art.

Referring still to FIG. 5, the optional DC power supply 50 may be directly coupled to upper electrode 52, or it may be coupled to the RF transmission line extending from an output end of impedance match network 72 to upper electrode 52. An electrical filter may be utilized to de-couple RF power from DC power supply 50.

Figure 6:
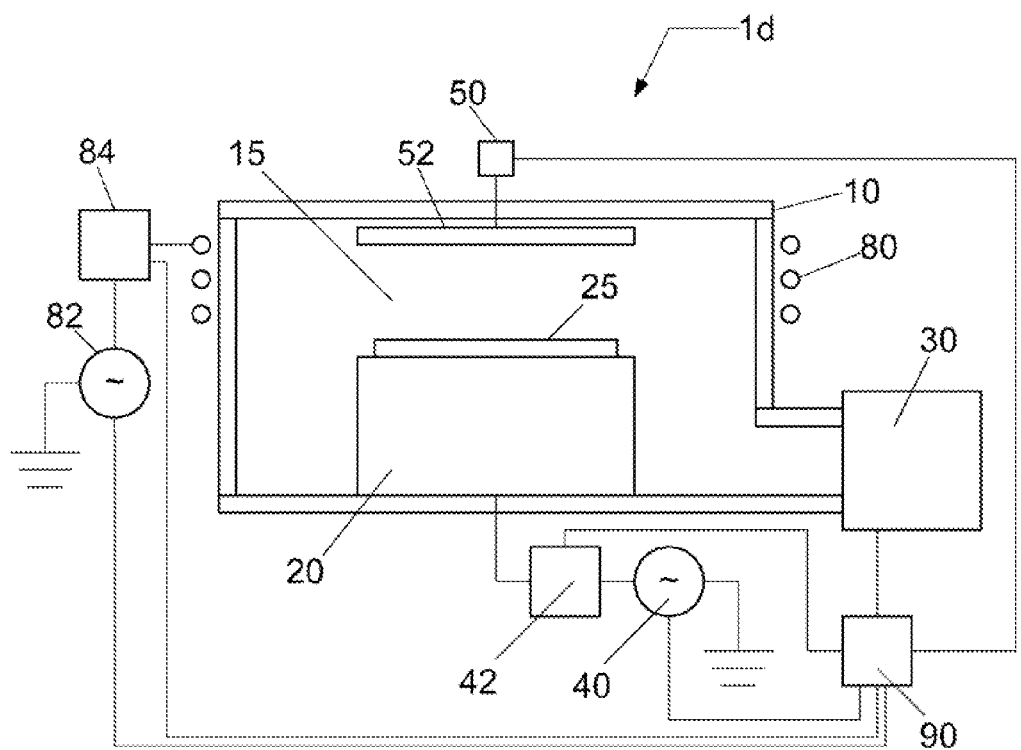
FIG. 6 shows a schematic diagram of a plasma processing system according to another embodiment.

In the embodiment shown in FIG. 6, the plasma processing system 1d can, for example: be similar to the embodiments of FIGS. 2, 3 and 4, and can further comprise an inductive coil 80 to which RF power is coupled via RF generator 82 through an optional impedance match network 84. RF power is inductively coupled from inductive coil 80 through a dielectric window (not shown) to plasma processing region 15. A typical frequency for the application of RF power to the inductive coil 80 can range from about 10 MHz to about 100 MHz. Similarly, a typical frequency for the application of power to the substrate holder 20 (or lower electrode) can range from about 0.1 MHz to about 100 MHz. In addition, a slotted Faraday shield (not shown) can be employed to reduce capacitive coupling between the inductive coil 80 and plasma. Moreover, controller 90 is coupled to RF generator 82 and impedance match network 84 in order to control the application of power to inductive coil 80. In an alternate embodiment, inductive coil 80 can be a "spiral" coil or "pancake" coil in communication with the plasma processing region 15 from above as in a transformer coupled plasma (TCP) reactor. The design and implementation of an inductively coupled plasma (ICP) source, or transformer coupled plasma (TCP) source, is well known to those skilled in the art.

Alternately, the plasma can be formed using electron cyclotron resonance (ECR). In yet another embodiment, the plasma is formed from the launching of a Helicon wave. In yet another embodiment, the plasma is formed from a propagating surface wave. Each plasma source described above is well known to those skilled in the art.

Figure 7:
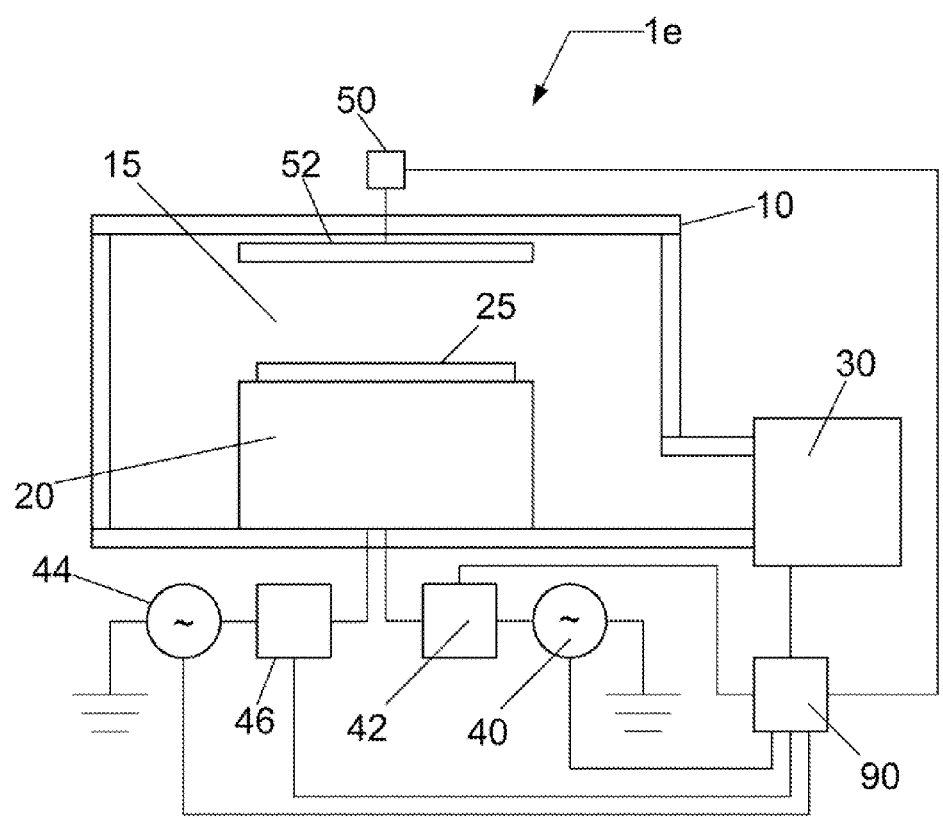
FIG. 7 shows a schematic diagram of a plasma processing system according to another embodiment.

In the embodiment shown in FIG. 7, the plasma processing system 1e can, for example, be similar to the embodiments of FIGS. 3, 4 and 5, and can further comprise a second RF generator 44 configured to couple RF power to substrate holder 20 through another optional impedance match network 46. A typical frequency for the application of RF power to substrate holder 20 can range from about 0.1 MHz to about 200 MHz for either the first RF generator 40 or the second RF generator 44 or both. The RF frequency for the second RF generator 44 can be relatively greater than the RF frequency for the first RF generator 44. Furthermore, the RF power to the substrate holder 20 from RF generator 40 can be amplitude modulated, or the RF power to the substrate holder 20 from RF generator 44 can be amplitude modulated or both RF powers can be amplitude modulated. For example, the RF power at the higher RF frequency is amplitude modulated. Moreover, controller 90 is coupled to the second RF generator 44 and impedance match network 46 in order to control the application of RF power to substrate holder 20. The design and implementation of an RF system for a substrate holder is well known to those skilled in the art.

In the following discussion, a method of etching a metal nitride layer utilizing a plasma processing device is presented. For example, the plasma processing device can comprise various elements, such as described in FIGS. 2 through 7, and combinations thereof.

In one embodiment, the method of etching a metal nitride layer, such as a titanium nitride layer, comprises using a process composition having a halogen-containing gas and a hydrocarbon-containing gas having the chemical formula $C_xH_y$, where x and y are equal to unity or greater. The halogen-containing gas can include, for example, $Cl_2$, HBr, or $BCl_3$, or a combination of two or more thereof. Additionally, for example, the hydrocarbon-containing gas can include $CH_4$, $C_2H_4$, $C_2H_2$, $C_2H_6$, $C_3H_4$, $C_3H_6$, $C_3H_8$, $C_4H_6$, $C_4H_8$, $C_4H_{10}$, $C_5H_8$, $C_6H_{10}$, $C_6H_6$, $C_6H_{10}$, or $C_6H_{12}$, or a combination of two or more thereof. The process composition can further include an inert gas, such as a noble gas (e.g., He, Ne, Ar, Kr, Xe).

For example, a process parameter space can comprise a chamber pressure of about 5 to about 1000 mTorr, a halogen containing gas process gas flow rate ranging from about 1 to about 500 sccm, a hydrocarbon ($C_xH_y$) process gas flow rate ranging from about 1 to about 500 sccm, an optional inert process gas flow rate ranging from about 0 to about 500 sccm, an upper electrode (UEL) (e.g. element 52 in FIG. 5) RF bias ranging from about 0 to about 2000 W, and a lower electrode (LEL) (e.g., element 20 in FIG. 5) RF bias ranging from about 10 to about 1000 W. Also, the upper electrode bias frequency can range from about 0.1 MHz to about 200 MHz, e.g., about 60 MHz. In addition, the lower electrode bias frequency can range from about 0.1 MHz to about 100 MHz, e.g., about 2 MHz.

Figure 8:
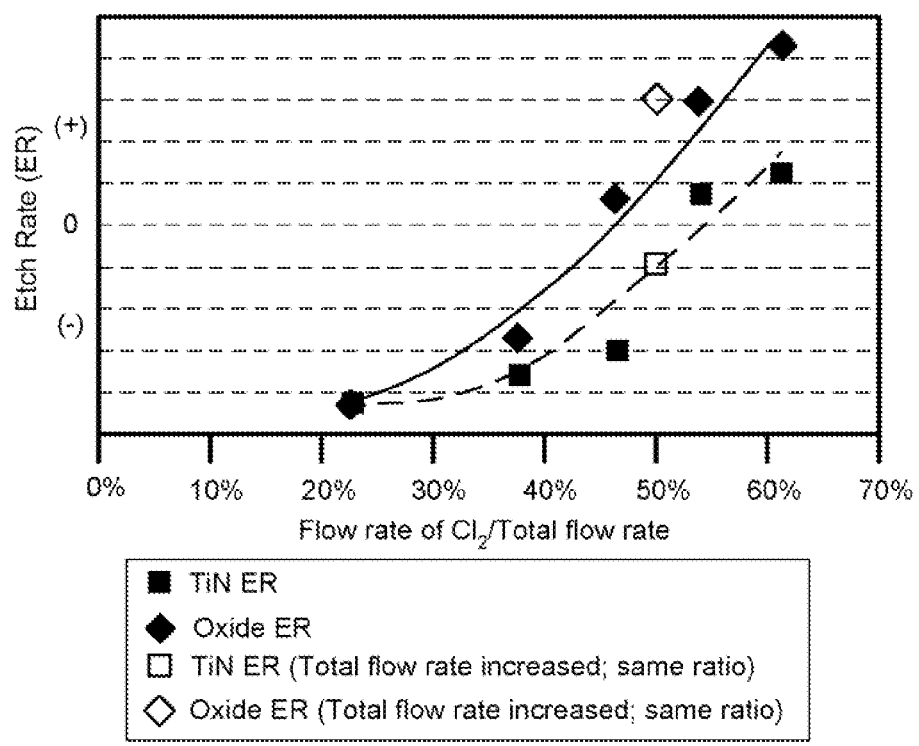
FIG. 8 illustrates exemplary process data for etching a metal nitride layer.

In one example, a method of etching a titanium nitride layer utilizing a plasma processing device such as the one described in FIG. 5 is presented. However, the methods discussed are not to be limited in scope by this exemplary presentation. Using a process composition comprising $Cl_2$, $CH_4$, and Ar, FIG. 8 illustrates the dependence of the etch rate of titanium nitride (solid squares) and the etch rate of silicon dioxide (solid diamonds) on the amount of $Cl_2$ relative to the total flow rate excluding argon (i.e., flow rate of $Cl_2$ and flow rate of $CH_4$). For each set of data curves (solid squares solid line; and solid diamonds, dashed line), the total flow rate is held constant, while the fractional amount of $Cl_2$ is varied. For a relative amount of $Cl_2$ ranging from approximately 45% to 55%, the etch selectivity is infinite (since the etch rate of silicon dioxide is less than zero, i.e., deposition condition) while the etch rate for titanium nitride is positive. However, as the fractional amount of $Cl_2$ increases within approximately this range, the etch rate of titanium nitride increases.

Referring still to FIG. 8, two additional data points are shown for a given flow ratio (as defined above for $Cl_2$) and an increased total flow rate. The open square represents the respective titanium nitride etch rate, while the open diamond represents the respective silicon dioxide etch rate. For this relative ratio of $Cl_2$ (approximately 50%), the etch rate of titanium nitride increases with the increase in total flow rate, while the deposition condition for the silicon dioxide remains relatively unchanged.

With the exception of the relative flow rates, the remaining process conditions for FIG. 8 are held constant, as follows: the upper electrode (UEL) RF power (watts, W) is approximately 200 W, the lower electrode (LEL) RF power (W) is approximately 50 W, the pressure (p; millitorr, mTorr) is approximately 10 mTorr, the substrate temperature (T, °C.) is approximately 75° C. Other process conditions for the process conditions provided above include: UEL temperature (e.g., electrode 52 in FIG. 5) is approximately 80 degrees C.; and chamber wall temperature is approximately 60 degrees C.

Figure 9:
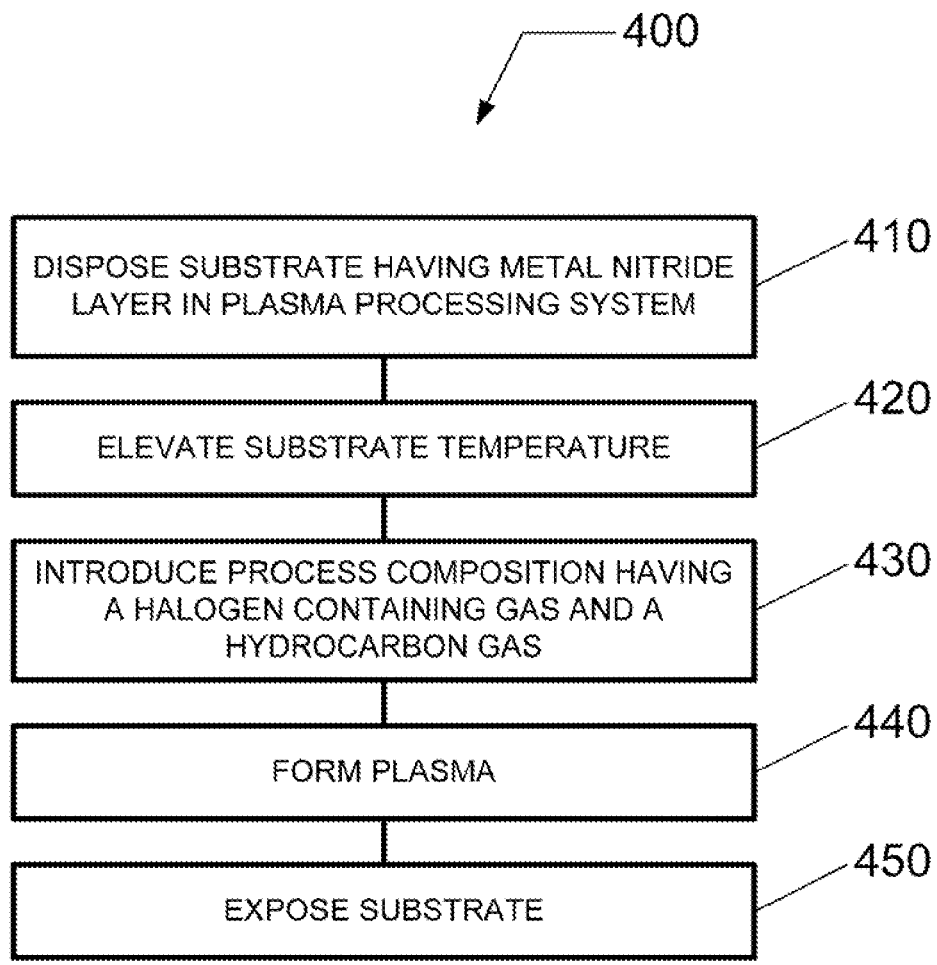
FIG. 9 presents a method of etching a metal nitride layer on a substrate in a plasma processing system according to an embodiment.

FIG. 9 presents a flow chart of a method of etching a metal nitride layer on a substrate in a plasma processing system according to another embodiment. Procedure 400 begins in 410 with disposing a substrate having a metal nitride layer thereon in a plasma processing system. The metal nitride layer can, for example, include a titanium nitride layer. The plasma processing system may, for example, comprise any of the systems described in FIGS. 2 through 7, or combinations thereof.

In 420, the temperature of the substrate is elevated to the process temperature. The temperature of the substrate can be elevated to a temperature of approximately 30 degrees C. or greater. Alternatively, the temperature of the substrate can be elevated to a temperature of approximately 50 degrees C. or greater. Alternatively, the temperature of the substrate can be elevated to a temperature of approximately 75 degrees C. or greater. Alternatively yet, the temperature of the substrate can be elevated to a temperature of approximately 100 degrees C. or greater, or even 200 degrees C. or greater. For example, the substrate temperature may range from approximately 50 degrees C. to approximately 250 degrees, and can range from approximately 50 degrees C. to approximately 100 degrees C.

In 430, a process composition comprising a halogen-containing gas and a hydrocarbon-containing gas having the chemical formula $C_xH_y$, where x and y are equal to unity or greater is introduced to the plasma processing system. For example, the halogen-containing gas can include $Cl_2$, HBr, or $BCl_3$, or a combination of two or more thereof. Additionally, for example, the hydrocarbon-containing gas can include $CH_4$, $C_2H_4$, $C_2H_2$, $C_2H_6$, $C_3H_4$, $C_3H_6$, $C_3H_8$, $C_4H_{10}$, $C_4H_8$, $C_4H_{10}$, $C_5H_8$, $C_5H_{10}$, $C_6H_6$, $C_6H_{10}$, or $O_6H_{12}$, or a combination of two or more thereof. The process composition can further include an inert gas, such as a noble gas (e.g., He, Ne, Ar, Kr, Xe).

In 440, plasma is formed in the plasma processing system from the process composition.

In 450, the substrate comprising the metal nitride layer is exposed to the plasma formed in 440 in order to pattern etch the metal nitride layer.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

The invention claimed is:

1. A method of etching a metal containing layer on a substrate, comprising:
    disposing said substrate having a titanium nitride layer in a plasma processing system;
    elevating the temperature of said substrate above approximately 30 degrees C.;
    introducing a process composition consisting of $Cl_2$, $CH_4$, and an optional noble gas to said plasma processing system;
    forming plasma from said process composition in said plasma processing system; and
    exposing said substrate to said plasma in order to etch said titanium nitride layer.

2. The method of claim 1, wherein said disposing comprises disposing a substrate having a high-k dielectric layer underlying said titanium nitride layer.

3. The method of claim 2, wherein said disposing a substrate having a high-k dielectric layer comprises disposing a substrate having a $SiO_2$ layer on said substrate.

4. The method of claim 1, wherein said disposing comprises disposing a substrate having a polysilicon layer overlying said titanium nitride layer.

5. The method of claim 1, wherein said elevating comprises elevating the temperature to approximately 50 degrees C. and greater.

6. The method of claim 1, wherein said forming said plasma comprises capacitively coupling power to said plasma, or inductively coupling power to said plasma, or both.

7. The method of claim 1, wherein said forming said plasma comprises coupling radio frequency (RF) power to a substrate holder upon which said substrate rests.

8. The method of claim 1, wherein said forming said plasma comprises coupling radio frequency (RF) power to an electrode positioned opposite a substrate holder upon which said substrate rests.

9. The method of claim 1, wherein the substrate includes a mask layer defining a pattern therein overlaying said titaniummetal nitride layer and said exposing etches said pattern into said titanium nitride layer.

10. The method of claim 1, wherein said disposing said substrate having a titanium nitride layer comprises disposing a substrate having a SiO$_2$ layer on said substrate.

11. The method of claim 10, further comprising:
adjusting the flow rates of said Cl$_2$ and said CH$_4$ to a predetermined level for achieving a positive etch rate for said titanium nitride layer and a zero etch rate for said SiO$_2$ layer.

12. The method of claim 11, wherein the flow ratio between said Cl$_2$, and the total flow of said Cl$_2$ and said CH$_4$ ranges from approximately 45% to approximately 55%.

13. The method of claim 11, wherein the flow ratio between said Cl$_2$, and the total flow of said Cl$_2$ and said CH$_4$ ranges from approximately 45% to approximately 50%.

14. The method of claim 11, wherein said elevating comprises elevating the temperature to approximately 75 degrees C.; wherein said forming said plasma from said process composition in said plasma processing system comprises setting a process pressure of approximately 10 mTorr, applying a first RF power of approximately 50 W to a first electrode upon which said substrate rests, and applying a second RF power of approximately 200 W to a second electrode that opposes said first electrode; and wherein the flow ratio between said Cl$_2$, and the total flow of said Cl$_2$ and said CH$_4$ is approximately 50%.

* * * * *